United States Patent [19]

Cutler

[11] 4,068,305
[45] Jan. 10, 1978

[54] ASSOCIATIVE PROCESSORS

[75] Inventor: Ronald Michael Cutler, Reading, England

[73] Assignee: Plessey Handel und Investments AG, Zug, Switzerland

[21] Appl. No.: 685,926

[22] Filed: May 12, 1976

[30] Foreign Application Priority Data

May 12, 1975 United Kingdom ............... 19930/75

[51] Int. Cl.² ........................................... G06F 13/00
[52] U.S. Cl. .................................................. 364/200
[58] Field of Search ...................................... 340/172.5

[56] References Cited

U.S. PATENT DOCUMENTS

| | | | |
|---|---|---|---|
| 3,106,698 | 10/1963 | Unger | 340/172.5 |
| 3,308,436 | 3/1967 | Borck, Jr. et al. | 340/172.5 |
| 3,364,472 | 1/1968 | Sloper | 340/172.5 |
| 3,815,095 | 6/1974 | Wester | 340/172.5 |
| 3,936,806 | 2/1976 | Batcher | 340/172.5 |
| 3,970,993 | 7/1976 | Finnila | 340/172.5 |

*Primary Examiner*—Raulfe B. Zache
*Attorney, Agent, or Firm*—Fleit & Jacobson

[57] ABSTRACT

A fully parallel, distributed logic associative processor, comprising a content-addressable memory having computational logic associated with each memory cell. The cells are arranged in a rectangular array, and logical operations may be performed between adjacent cells, or between the data being input to the machine, and the contents of a chosen word, or chosen words.

The type of logical operation may be chosen from the complete set of two-variable functions plus the single variable functions "transfer" and "invert". Several of the two-variable functions may be obtained by combining other two-variable functions with "invert". In some cases, single gates may perform both multiplexing and logical functions, or logical and storage functions.

Each store word is equipped with a response unit. This may be set during a match operation if a word matches the input word. During a match operation, all store words are searched simultaneously. Portions of the input word may be masked, and these bits are then not involved in the match operation. Instructions applied to the command inputs cause an operation to take place upon selected words. The selected words may comprise the entire store contents, all words with their response units set, or the first work in store with its response unit set. In the latter case, all words with the set response units may be processed consecutively. Otherwise the chosen data words will be processed simultaneously. The machine with a fixed number of output leads may have any desired number of words, and is particularly applicable to L.S.I. packaging.

The content addressable facility permits flexible and efficient addressing schemes to be used, and the word by word interrogation facility also makes the machine suitable for holding a program rather than data if required.

6 Claims, 4 Drawing Figures

ASSOCIATIVE PROCESSORS

The present invention relates to data processing equipment and is more particularly concerned with so-called associative processor equipment.

An associative processor is hereafter defined as a stored program digital processor having an associative (or content addressed) memory and capable of performing arithmetic or logical operations on all or some of the words in its associative memory simultaneously. This is compared with a so-called conventional digital processor that performs one operation on two words at a time.

A typical associative processor program uses one or more search operations to specify a particular subset of available words by their data content prior to performing a sequence of arithmetic or logic operations on the selected words.

In one prior art associative processor the arithmetic and logic capabilities are provided in each of the response store circuits of the associative store of the processor. Such an arrangement provides serial arithmetic/logic manipulative facilities for each word of the store. Processors of this type are disclosed in an aritcle by R. M. Lea entitled "Information Processing with an Associative Parallel Processor" published in the November issue 1975 of Computer on pages 25 to 32.

Serial arithmetic/logic manipulative facilities, however, are comparatively slow when considered against the search speed for such associative storage arrangements.

It is an object of the present invention to provide an associative processor having arithmetic/logic manipulative facilities operating at speeds which are comparable with those speeds achieved in associative store search operations.

According to the invention there is provided an associative processor includng an associative store having a memory array of associative memory cells arranged in equal multi-bit memory words and each memory word is provided with a discrete response circuit in which each memory cell includes logic manipulative means for performing logic functions on the data bit stored in the cell and each response circuit includes function operation means for controlling the logic manipulative means of the cells of the corresponding memory word, the associative processor being arranged such that the performance of logic manipulative operations on stored data words are confined within the memory array.

According to a preferred embodiment of the invention each memory cell includes means for conditioning the cell to assume a state indicative of i. the logic AND of an input data bit with the date bit stored in the cell, ii. the logic OR of an input data bit with the data bit stored in the cell, and iii. the inverse of the state of the data bit stored in the cell.

Also according to a preferred embodiment of the invention the output from each cell is connected to the input path of the corresponding cell in contiguous store words and the input path of contiguous bit cells of the same store word and each cell includes input path gating means for selecting the appropriate input data bit to be used in a logic operation.

The preferred embodiment also envisages the use of a common command signal highway connecting a program storage device to all the response circuits and carrying the logic manipulative operation control signals, and the function operation means of an active response unit are conditioned to pass the markings on the command signal highway.

The program storage device stores patterns of command signals which are used successively to cause the cells of a selected word or words to perform normal arithmetic and logic type computer instructions.

The command signal highway comprises an input/shift select wire, first and second cell function control wires, an invert wire, up, down, right and left shift control wires and a cell clock pulse wire and the markings on these wires cause the cells of a selected word to perform the logic manipulative operations involving the contiguous cells or the input register stages.

The invention, together with its various features will be more readily understood from the following description of one embodiment which should be read in conjunction with the accompanying drawings.

Figure 1:
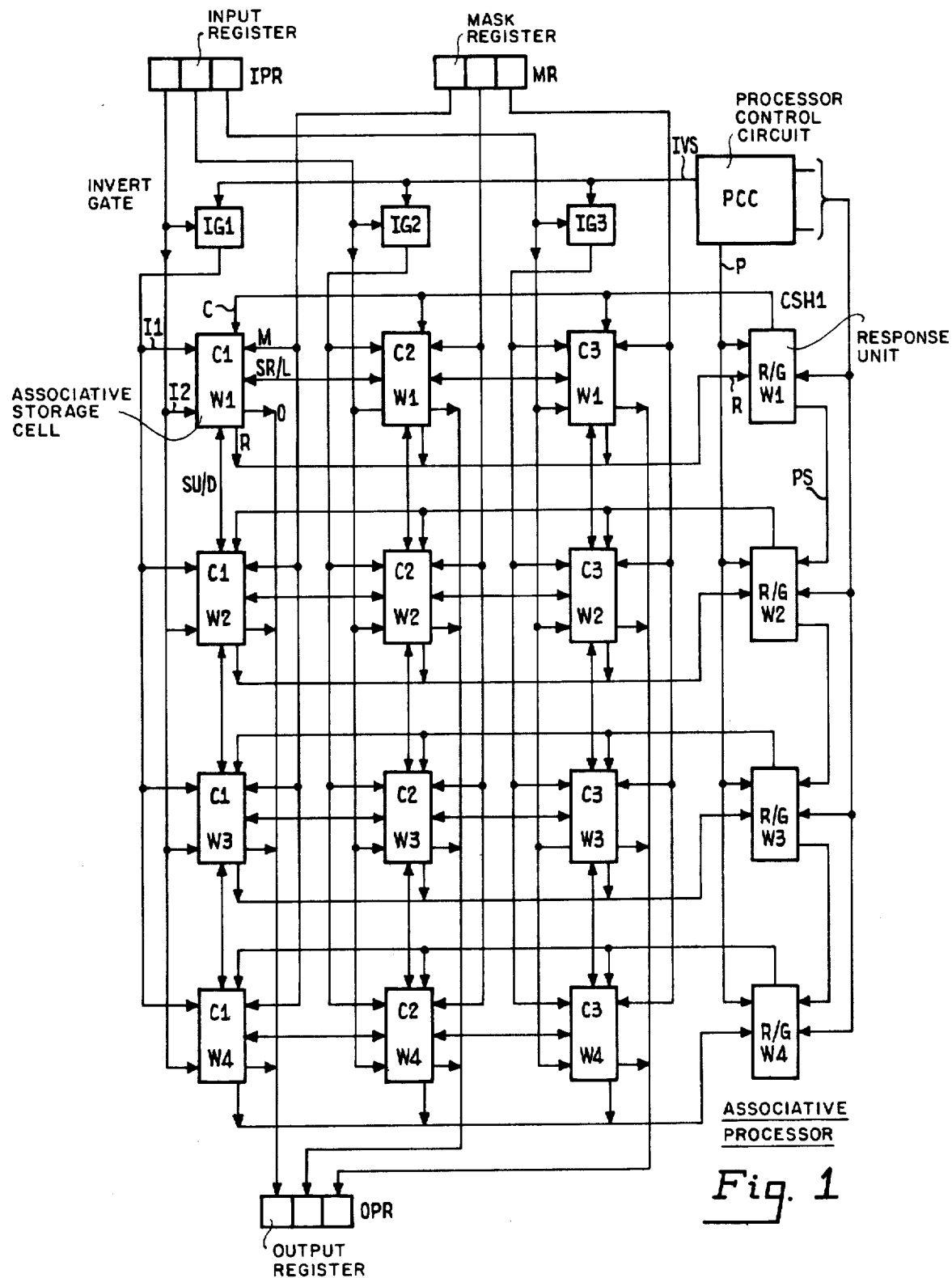
FIG. 1 shows a block diagram of an embodiment of an associative processor according to the invention.

An associative processor according to the embodiment of the invention is shown in FIG. 1 and comprises (i) a matrix of associative storage cells (C1W1 to C3W4) arranged in words, (ii) an input register IPR, (iii) a mask register MR, (iv) an output register OPR, (v) one response unit (such as R/GW1) for each word and (vi) a processor control circuit PCC.

The storage cells C1W1 to C3W3 are arranged as four words (W1 to W4) of three bits (C1 to C3) each. The cells form a four word content addressed (or associative) memory. In such a memory each cell is equipped with comparison logic which is used to compare the state of the bit stored in the cell with the corresponding bit of the input register IPR when a common cell clock pulse lead is pulsed. This clock pulse lead is not shown in FIG. 1 for ease of presentation. If a whole word corresponds to the input word the response unit R/G, attached to the matching word becomes set. A typical example of this operation of the associative memory may be summed-up by the following

|  | BIT 3 | BIT 2 | BIT 1 | R/G |
|---|---|---|---|---|
| WORD W1 | 1 | 0 | 1 | 1 |
| WORD W2 | 1 | 1 | 1 | 0 |
| WORD W3 | 0 | 0 | 1 | 0 |
| WORD W4 | 1 | 0 | 0 | 0 |
| IP WORD (IPR) | 1 | 0 | 1 | |

The capabilities of the associative memory are extended by adding a mask register MR to the system. This permits a selection of bits of each word to be "matched" to be made. Typically the mask facility is used when each word stored comprises "address" and "data". The mask register may then be used to define the bits used for the address. The selection of bits in each word defined by the mask is compared with the corresponding bits of the input word and those words having corresponding bit patterns have their response units set.

Considering the simple example given above if the mask register contains the code 110 the response units R/GW1 and R/GW4 will both be set as bit 1 of each stored word is no longer relevant to the match operation. Bit 1 of the mask being a 0 removes bit 1 of the input word for the match operation.

In the above operation the required data word or words are defined by the response units which are set. The response units serve as a means of addressing words in the store by marking the words to be operated upon.

In addition to the normal associative store arrangements the equipment of FIG. 1 includes data transfer paths between contiguous bits of a word (i.e. between cells C2 and C3 and C1 and C2 for example) in both directions and between corresponding bits of contiguous words (i.e. between corresponding cells in words W1 and W2 and W2 and W3 for example). These data transfer paths, together with the functions performed by the cells of a word, are controlled by a control signal highway such as CSH1.

Figure 2:
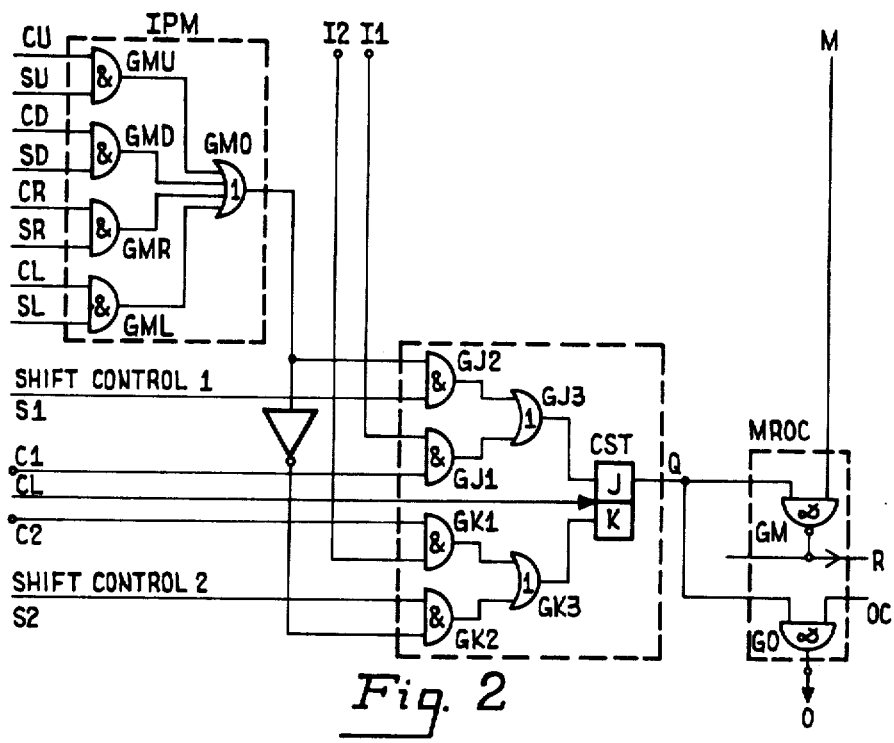
FIG. 2 shows the logic diagram of a cell for use in FIG. 1 and according to the embodiment of the invention.

Each cell consists of a data storage device and input and output gating logic. FIG. 2 shows a preferred embodiment of cell design for use with positive logic signals. The cell consists of three main sections; (i) an input multiplexer IPM, (ii) a cell storage toggle CST and (iii) the mask response and output circuits MROC. The cell storage toggle is of the so-called JK type having AND-/OR input gating to each input. Typically the JK toggle may be of integrated circuit form using a TTL series 54/74 circuit such as type SN74H101 made by Texas Instruments Ltd. The truth table for such a circuit is shown on page 78 of the "The TTL Data Book for Design Engineers". First Edition published by Texas Instruments Limited and is reproduced below:

| Inputs | | | | Outputs | |
| --- | --- | --- | --- | --- | --- |
| Preset | Clock | J | K | Q | Q̄ |
| H | ↓ | L | L | Qo | Q̄o |
| H | ↓ | H | L | H | L |
| H | ↓ | L | H | L | H |
| H | ↓ | H | H | TOGGLE | |
| H | H | X | X | Qo | Q̄o |

Note in the above
H = high level (steady state)
L = low level (steady state)
X = irrelevant
↓ = transition from high to low level
Qo = the level of Q before the indicated input conditions were established
TOGGLE: Each output changes to the complement of its previous level on each active transition of the clock.

Included in the JK storage toggle package are two pairs of AND gates ORed into each toggle input path. These gates are shown as GJ1, GJ2 and GJ3 respectively for the J input and GK1, GK2 and GK3 respectively for the K input in FIG. 2. These gates control the logic functions performed by the cell unit. Gates GJ1 and GK1 act as input control gate and are controlled by control signals C1 and C2 permitting cell transactions to be performed involving the input leads I1 and I2 respectively. Gates GJ2 and GK2 act as shift input control gates and are controlled by the shift control signals S1 and S2 permitting cell transactions to be performed involving the "chosen" contiguous cell. The selection of the contiguous cell (i.e. either the cell to right or left in the same word, or the corresponding cell in the word "above" or "below" the particular word) to be used to provide the input to the particular cell is performed by the input multiplexor gates IPM. Gate GMR controls the selection of the cell to the right, gate GML controls the selection of the cell to the left, gate CMU controls the selection of the correspondng cell in the word "above" while gate GMD controls the selection of the corresponding cell in the word "below". The control signals CR, CL, CU and CD respectively prime these AND gates for the selection arrangement and the selected cell output condition is applied, over OR gate CMO, to the shift input control gates GJ2 and GK2.

In operation the control signals control the logic function selected. Considering firstly the input control signals C1 and C2 it will be seen that if these signals are both set to '1' the value of the state of the input bit, as defined by the states of I1 and I2, will appear at the output of the JK toggle when the clock signal on lead CL occurs. For example if I1 = 1 and I2 = 0, Q will be set to the '1' state. Conversely if I1 = 0 and I2 = 1, Q will be set to the '0' state. The value attained by the JK will remain when C1 and C2 return to the zero state. If C1 is set to '1' and C2 is set to '0' the output Q will become '1' if I1 = 1. If I1 = 0, the original cell contents will be retained. Accordingly the cell performs an OR function involving the input leads and the stored bit when C1 = 1 and C2 = 0.

If C1 = 0 and C2 = 1 the cell contents will only change if I2 = 1 and I1 = 0 and then the contents of the cell will become '0' (i.e. Q = 0). Accordingly the cell performs an AND function involving the input leads and the stored bit when C1 = 0 and C2 = 1.

It will be recalled that the toggle used for the cell storage function is a JK toggle of the 54/74 family of compatible TTL circuits and reference to page 127 of the first edition of "TTL Data Book for Design Engineers" shows that this toggle is of the so-called master/slave type. Also the truth table for the JK toggle shown above indicates that if both input leads to the JK toggle are held high (i.e. at the '1' state) the toggle performs a TOGGLE action which is in fact the function of inverting the data bit in the cell. Hence if the invert function is required control leads C1 and C2 are driven to the '1' state and both leads I1 and I2 are driven to the '1' state. Typically the invert function is achieved in the associative store using the invert gates IG1, IG2 and IG3 shown in FIG. 1. Each of these gates consists of an exclusive OR circuit followed by an inverter. The gates each have two inputs one from the input bit and the other from the inversion control signal IVS and these inputs are applied to the exclusive OR gate. Accordingly a '0' condition on the inversion control signal lead IVS causes the leads I1 and I2 to assume opposite states dictated by the data in the input register. Accordingly the data in the input register may be loaded into a selected word when IVS = 0. A '1' condition on the inversion control signal lead IVS, however, causes the data bits in those cells defined by the '1' state bit pattern in the input register IPR to be inverted when the common clock pulse occurs.

The operations controlled by the signals C1 and C2 may also be performed relative to the contiguous bits by the use of the input multiplexor IPM to select the required bit and the shift control signals S1 and S2. Signals S1 and S2 perform the same operations as signals C1 and C2 allowing the cell to be loaded (S1 = S2 = 1), the cell contents to be ORed with the selected bit (S1 = 1; S2 = 0) or to be ANDed with the selected bit (S1 = 0; S2 = 1) when the clock signal CL occurs. The use of a master/slave type of toggle for cell storage permits the shift operations to be performed as each toggle consists of two bistables. During a transfer, the contents of the "second" bistable in each cell is passed to the "first" bistable of the contiguous cell. To complete the transfer the contents of each "first" bistable is transferred into each "second" bistable. Also included in each cell is an output gate GO controlled by an output control signal DC and a mask control gate GM. The mask gate's output is ORed onto the word response wire R of the matrix. For the majority of associative store operations a mask capability is necessary. As mentioned previously a mask register, such as MR in FIG. 1, is provided and the pattern of bits in this register is used to define the field to be compared during a match operation. During the match operation masked bits are disregarded and by the provision of a NAND gate in each cell of each word the response unit of only those words whose NAND gate are all at logic '1' will be set. This means that at least one input of each gate must be at '0', which means in turn that each bit must either match the input word or be masked.

The actual operations performed in a match operation may use well known techniques such as that involving two phases of inversion. Firstly wherever the input bit in register IPR equals '1' the contents of the corresponding store cells are inverted. As a result all store words matching the input word become logic '0' throughout. Wherever this is true the corresponding word response unit is set. The second phase involves inverting the same set of bits a second time restoring the store contents to the original state while leaving the matched word response units set.

Figure 3:
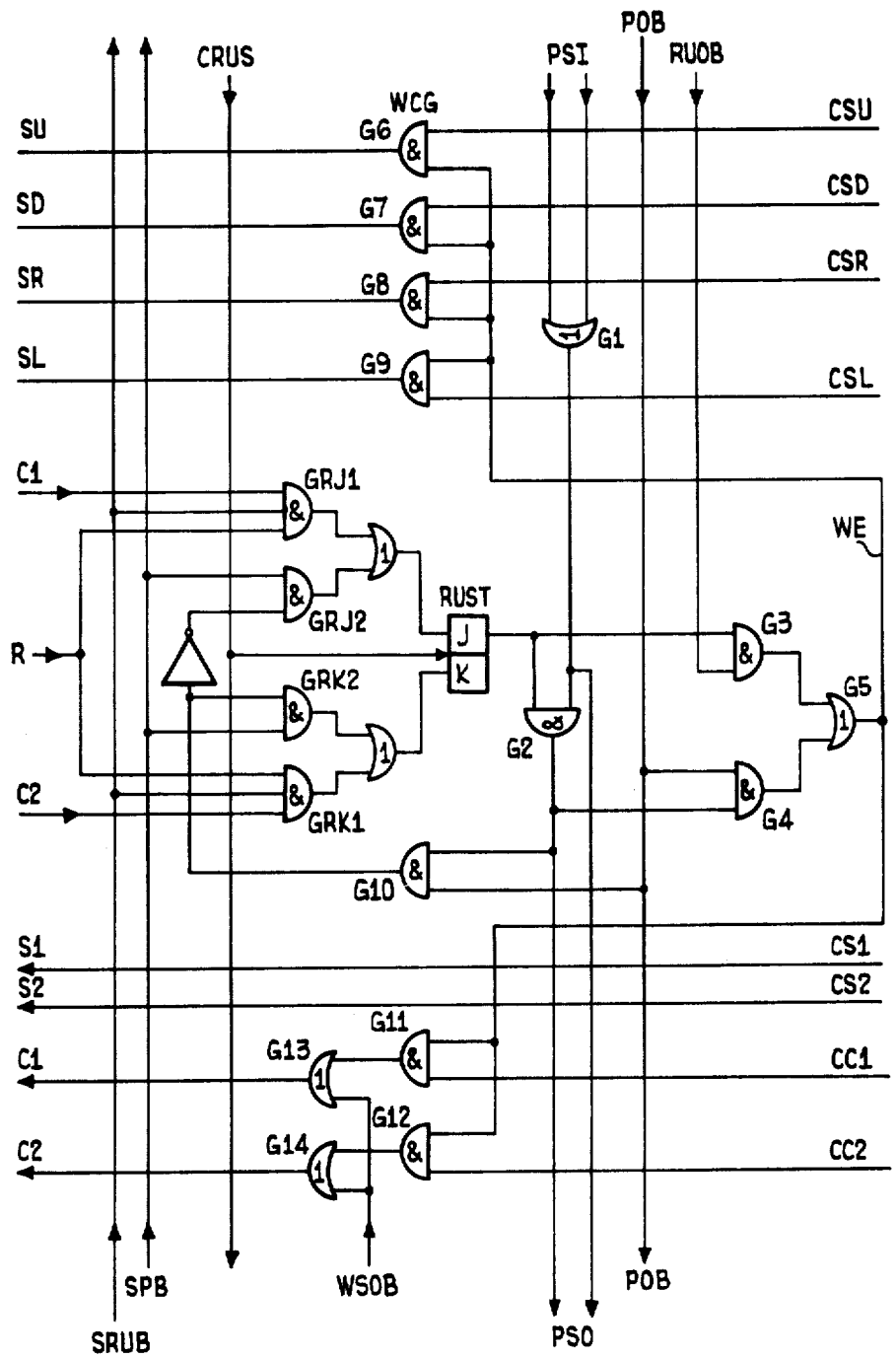

At the end of each match operation the response units corresponding to the words matching the input "address" will be set. FIG. 3 shows a typical response unit. The centre of the response unit is a JK bistable, typically of the SN 74101 type, having a similar configuration to a cell storage toggle. The input gates GRJ1 and GRK1 may be used to control the functions performed by the response unit and under most normal circumstances these gates will be used to control the loading of the response toggle with the state of the response line R of the associated word when the response unit clock pulse on lead CRUS occurs. The C1 and C2 lead conditions will both be in the '1' state when the response unit clock pulse occurs although facilities are provided for ANDing (C1 = 0; C2 = 1) the current response line R condition with the current state of toggle RUST or ORing (C1 = 1; C2 = 0) the current response line state with the current toggle RUST state.

The set state of a response toggle allows the processor control circuit PCC in FIG. 1 to selectively apply the control signals to the selected associative store word. The control signals involve (i) the shift directional signals S.U. (shift up), SD (shift down), SR (shift right) and SL (shift left) (ii) the shift control signals S1 and S2 and (iii) the function control signals C1 and C2. The shift directional signals are controlled by AND gates G6 and G9 inclusive whereas the function control signals C1 and C2 are controlled by gates G11 and G12. When the processor control circuit PCC requires to control the functions of the cells of a selected word or words it generates a '1' state signal on the response unit operate bus and this causes AND gate G3 to open in all those response units currently set. Gate G3 causes, through OR gate G5, the word enable signal WE to be generated to open gates G6 to G9 and G11 and G12 thereby extending the control signals to the cells of the associated word. As a result all words with their response units set will be operated on by the command signals.

The use of response units for controlling processor transactions presents certain difficulties, as several response units may become active simultaneously. In some applications it is necessary to process the items of the active sets consecutively. The simplest means of resolving this is to use a consecutive priority circuit. This enables the activated store words to be acted upon consecutively. The multiple match resolution arrangements involve gates G1, G2 and G4 in the response unit of FIG. 3. The method of operation is based upon the fact that when a set of response units become active the highest priority unit inhibits all the active units which are of a lower priority. This is achieved by the use of the priority sequence leads PSI and PSO, the associated gates G1, G2 and G10, the step priority units bus SPB and the priority operation bus POB. In this case the "word enable" line WE is controlled by the output from gate G2 by way of gate G4.

Finally the response unit of FIG. 3 includes a "whole store operate" bus WSOB. This allows the associative store to be operated in a so-called "store" mode in which all words are acted upon regardless of the states of the priority gates and response units.

The word enable signal on lead WE as mentioned previously causes the command wire bit patterns to be passed on only to those words having their response unit set. Accordingly when an input pattern is applied to the input register IPR a match operation will be performed by activating to the '1' state lead WSOB in FIG. 3. This causes gates G13 and G14 to pass a C1 = 1 and C2 = 1 condition on to all the store words. This causes a match operation to occur throughout the whole store. As a consequence only those words having their response units set will be subsequently operated upon by the bit pattern applied by the processor control circuit PCC. An example of a typical computation operation using the associative processor of the embodiment of the invention will now be given.

It will be assumed that the operation required is simply to right shift all words in the four word (3 bits per word) store of FIG. 1 having a '1' in the first bit position and to perform a priority store readout operation. The following bit patterns will be assumed at the start of the operation.

| B1 | B2 | B3 | R/G |   |
|----|----|----|-----|---|
| 1  | 0  | 1  | 0   | WORD 1 |
| 0  | 1  | 1  | 0   | WORD 2 |
| 0  | 0  | 1  | 0   | WORD 3 |
| 1  | 1  | 0  | 0   | WORD 4 |

The input register IPR would hold the code 1XX while the mask register MR would hold the code 011.

After the match operation the bit patterns will be as follows:

| B1 | B2 | B3 | R/G |
|----|----|----|-----|
| 1  | 0  | 1  | 1   |
| 0  | 1  | 1  | 0   |
| 0  | 0  | 1  | 0   |
| 1  | 1  | 0  | 1   |

The code for right shift is now applied to the code wires (S1 = 1; S2 = 1 and SR = 1) and only word 1 and 4 will have these conditions applied to their cells. This conditions each cell of the selected word to "load" the cell storage toggle with the condition provided by the output of the input multiplexor when the clock pulse is received. Signal SR being in the '1' state defines that the contiguous cell to the left provides the input state.

When the common cell clock lead is pushed all words with their response units set will be shifted right by one place and the states of the store will be as follows:

| B1 | B2 | B3 | R/G |
|----|----|----|-----|
| 0  | 1  | 0  | 1   |
| 0  | 1  | 1  | 0   |
| 0  | 0  | 1  | 0   |
| 0  | 1  | 1  | 1   |

It has been assumed that bit 1 of each word shifted is set to the '0' state after the shift operation.

Finally a priority operation is performed and sequential pulsing of the response unit clock lead will cause (i) the resulting of response unit R/G W1 and the 010 pattern of word one to be written into the output register OPR and (ii) the resetting of response unit R/G W4 and the 011 pattern of word four to be written into the output register OPR.

Finally with the shift operation and priority output operation complete the store bit pattern will be as follows:

| B1 | B2 | B3 | R/G |        |
|----|----|----|-----|--------|
| 0  | 1  | 0  | 0   | WORD 1 |
| 0  | 1  | 1  | 0   | WORD 2 |
| 0  | 0  | 1  | 0   | WORD 3 |
| 0  | 1  | 1  | 0   | WORD 4 |

Figure 4:
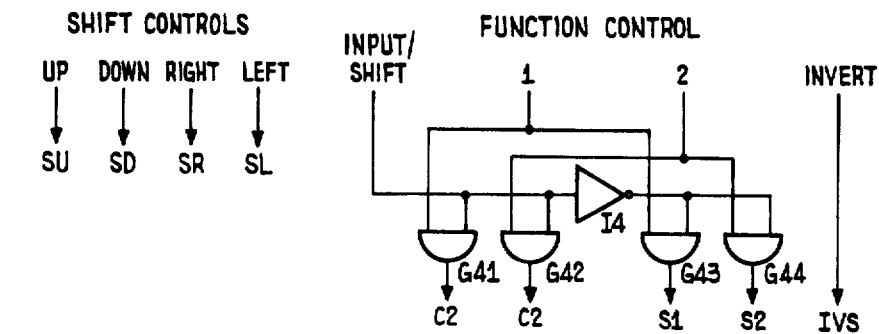
FIG. 3 shows the logic diagram of a response circuit sutiable for use with the embodiment of the invention and FIG. 4 shows a command signal highway for use with the embodiment.
Figure 4:
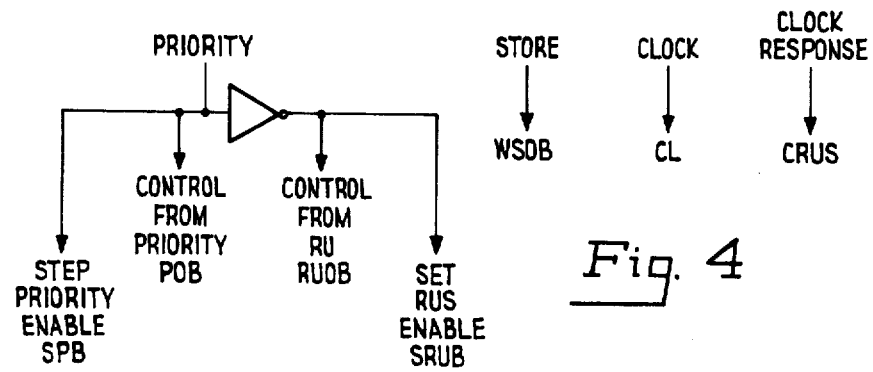

Because the command signal highway is trunked around all the response units and then to all the cells of the words of the store it is advantageous to reduce the wires required between the processor control circuit PCC and the response units. FIG. 4 shows how some of the signal paths may be combined. Control signal C1 is combined with S1, and C2 with S2 to form function control 1 and 2 signals. An "input/shift" select signal is provided, so that the two operations may be distinguished. The command signals are decoded using gates G41, G42, G43 and G44 together with inverter I4. The priority lines are similarly combined. If the single "priority" line is at '1', priority operations are possible. Word gating is then taken by way of the priority gates, and the "steps priority" facility is enabled. This permits the control to pass down all words with response lines active word by word. If the priority line is at '0', word gating is controlled directly from the response units.

In FIG. 4 the references at the "bottom" of each lead corresponds with those appearing in FIG. 1, FIG. 2 or FIG. 3 as appropriate.

Command Wires

The commanded wires are as follows:
1. Input/shift select
2. Control 1
3. Control 2
4. Invert
5. Internal Up
6. Internal Down
7. Internal Right
8. Internal Left
9. Priority
10. Store
11. Clock
12. Clock response units By setting the command bits to the required pattern, the associative processor can be made to perform any required instruction. The associative processor of the invention can be programmed to perform a sequence of instructions by using random access or read only memory storage in the processor control circuit PCC to store the instructions. In this way, the associative processor can perform a program after the manner of a conventional computer. If program loops are required, additional circuitry is needed to control the accessing of the RAM or ROM. The addressing of the RAM may be achieved by using a binary counter. In a normal operation, the counter simply progresses one address at a time. If a loop is required, the counter must be reset to a previous address. It is possible that a microcomputer could be used to provide the instruction sequence ncessary for the implementation of the processor control circuit PCC.

From the above description it can be seen that a number of basic instructions for an associative processor according to the embodiment of the invention may be derived. Also compound instructions may be derived from the basic subset. Typically instruction words may be derived giving a bit pattern in accordance with the states of the 12 wires of the command signal highway output (i.e. the ten command wires plus the two clock control wires) from the processor control circuit PCC.

The instruction word may be divided into three groups of bits. The first group determines which words are operated upon. The second group determines the direction of the operation. The third group determines the type of operation to be performed. By combining one code from each group, the complete set of commands may be derived.

The codes in each group are shown in Table 1. The first group consists of the type of operation. This may be an operation on all words, an operation on words with their response units set, or a priority operation.

Table 1

| Group 1 | Shift/Input | Control 1 | Control 2 | Invert | Up | Down | Right | Left | Priority | Store |
|---------|-------------|-----------|-----------|--------|----|----|-------|------|----------|-------|
| Whole store operations |  |  |  |  |  |  |  |  | 0 | 1 |
| Operate on words with response units set |  |  |  |  |  |  |  |  | 0 | 0 |
| Priority operation |  |  |  |  |  |  |  |  | 1 | 0 |
| Group 2 |  |  |  |  |  |  |  |  |  |  |
| Operate with word above | 0 |  |  |  | 1 | 0 | 0 | 0 |  |  |
| Operate with word below | 0 |  |  |  | 0 | 1 | 0 | 0 |  |  |
| Operate with bit to left | 0 |  |  |  | 0 | 0 | 0 | 1 |  |  |
| Operate with bit to right | 0 |  |  |  | 0 | 0 | 1 | 0 |  |  |
| Operate with input word | 1 |  |  |  | 0 | 0 | 0 | 0 |  |  |
| Group 3 |  |  |  |  |  |  |  |  |  |  |

Table 1-continued

| | The Instruction Set | | |
|---|---|---|---|
| And | 0 | 1 | 0 |
| Or | 1 | 0 | 0 |
| Invert | 1 | 1 | 1 |
| Load, shift | 1 | 1 | 0 |
| No operation | 0 | 0 | 0 |
| | 1 2 3 | 4 5 6 7 8 9 | 10 |

The second group determines the "direction" of the operation. This may be upwards, downwards, to the right, to the left, or with the input word.

The third group details the type of operation. This consists of the primities AND, OR, INVERT, LOAD or SHIFT and NO-OPERATION.

Group 1 occupies bits nine and ten of any command. Group 2 occupies bits one and five to eight. Group three occupies bits two to four.

The compound operations are examples of complete instructions. Bits from group 1, group 2 and group 3 are specified. The parts of store, the direction of operation and the type of operation are all known. Other operations can be similarly built up. There are 60 simple combinations which can be constructed by selecting one combination from the first group, one from the second group, and one from the third. The no operation command is not included in this. In addition, various other operations are possible which combine two bit patterns simultaneously. The swap operation is an example. It involves swapping two adjacent store words. Also, sequences of operations can be used to generate more complex functions. The most important of these is the match operation. Others include binary addition, multiplication, and any other microprogrammed operation which is required.

It should be noted that there is no output instruction. The outputs from the cells are wire OR-ed, and are controlled by the priority gates in such a way that there will be an output whenever only one response unit is set. Outputs will therefore appear throughout a priority operation of any kind.

The Match Operation

The match operation is a two phase operation. The first phase consists of inverting all store bits corresponding to a logic 1 in the input word. After this, all store words equalling to the input word will be logic 0 throughout. This first operation requires a logic 1 in the invert position, a logic 1 in the Input/shift position, and a 1 in positions C1 and C2, the two control wires. The "Store" line must also be set to one to ensure that the whole store is operated upon. The clock line is then pulsed in order to carry out this operation. Secondly, the appropriate response units must be set. This is done by ensuring the priority line is set to 'O', then pulsing the "Clock response units" line. The appropriate response units will then become set.

Finally, with the command bit pattern still unchanged, the "clock" line is pulsed again. This returns the store to its original state. The operations can be summarised as follows:

| S/I | C1 | C2 | INV | U | D | R | L | P | S | Cl | R.Cl |
|---|---|---|---|---|---|---|---|---|---|---|---|
| 1 | 1 | 1 | 1 | 0 | 0 | 0 | 0 | 0 | 0 | ⎍ | |
| 1 | 1 | 1 | 1 | 0 | 0 | 0 | 0 | 0 | 1 | | ⎍ |
| 1 | 1 | 1 | 1 | 0 | 0 | 0 | 0 | 0 | 1 | ⎍ | |

A Typical Computation

A typical computation consists of three steps. Firstly, the data to be operated upon is identified. Secondly, the operation is carried out, and finally, data is read out from the processor.

The data is identified in the associative processor by the match procedure. The known field of the required data is applied to the inputs whilst the other bits are masked. The pattern 1 1 1 1 0 0 0 0 0 1 is applied to the command inputs, and the clock is pulsed. The response clock is then pulsed. This sets the response units of the required words. Finally, the data is restored to its original condition by pulsing the clock units again.

The required store words are now marked. It is then possible to go through these words one by one, if differing operations are required on each word, using other priority lines. To do this, the last command bits are set to 10. When a word has been processed, the response clock is pulsed. This allows the rest of the words to be accessed. Alternatively, the whole set of data can be accessed simultaneously, if the same operation is to be applied to the whole data set. To do this, the last two bits are set to 00.

Finally, the data is outputted. To do this, the machine is put in the priority mode, and the response units to all required words set. The response clock is pulsed after reading out each word, allowing the machine to step on to the next store word. As the output operation does not require a unique code, output operations can be executed concurrently with any other priority operation.

Three groups of instruction bits are provided. By combining codes from these groups in various ways, a wide range of operations can be performed.

A tupical instruction set for an associative processor is shown in the following tables.

TABLE 2

| | OPERATIONS ON WHOLE STORE | | | | | | | | | | |
|---|---|---|---|---|---|---|---|---|---|---|---|
| | S | C1 | C2 | I | U | D | R | L | P | S Cl | RC |
| AND words with word above | 0 | 0 | 1 | 0 | 0 | 1 | 0 | 0 | 0 | 1 ⎍ | 0 |

TABLE 2-continued

| OPERATIONS ON WHOLE STORE | S | C1 | C2 | I | U | D | R | L | P | S | Cl | RC |
|---|---|---|---|---|---|---|---|---|---|---|---|---|
| AND with word below | 0 | 0 | 1 | 0 | 1 | 0 | 0 | 0 | 0 | 1 | ⎍ | 0 |
| AND with bit to right | 0 | 0 | 1 | 0 | 0 | 0 | 1 | 0 | 0 | 1 | ⎍ | 0 |
| AND with bits to left | 0 | 0 | 1 | 0 | 0 | 0 | 0 | 1 | 0 | 1 | ⎍ | 0 |
| AND with input word | 1 | 0 | 1 | 0 | 0 | 0 | 0 | 0 | 0 | 1 | ⎍ | 0 |
| OR with word above | 0 | 1 | 0 | 0 | 0 | 1 | 0 | 0 | 0 | 1 | ⎍ | 0 |
| OR with word below | 0 | 1 | 0 | 0 | 1 | 0 | 0 | 0 | 0 | 1 | ⎍ | 0 |
| OR with bits to right | 0 | 1 | 0 | 0 | 0 | 0 | 1 | 0 | 0 | 1 | ⎍ | 0 |
| OR with bits to left | 0 | 1 | 0 | 0 | 0 | 0 | 0 | 1 | 0 | 1 | ⎍ | 0 |
| OR with input word | 1 | 1 | 0 | 0 | 0 | 0 | 0 | 0 | 0 | 1 | ⎍ | 0 |
| Shift up | 0 | 1 | 1 | 0 | 1 | 0 | 0 | 0 | 0 | 1 | ⎍ | 0 |
| Shift down | 0 | 1 | 1 | 0 | 0 | 1 | 0 | 0 | 0 | 1 | ⎍ | 0 |
| Shift right | 0 | 1 | 1 | 0 | 0 | 0 | 1 | 0 | 0 | 1 | ⎍ | 0 |
| Shift left | 0 | 1 | 1 | 0 | 0 | 0 | 0 | 1 | 0 | 1 | ⎍ | 0 |
| Load store | 1 | 1 | 1 | 0 | 0 | 0 | 0 | 0 | 0 | 1 | ⎍ | 0 |
| Invert bits marked at input | 1 | 1 | 1 | 1 | 0 | 0 | 0 | 0 | 0 | 1 | ⎍ | 0 |
| One propagate vertically | 0 | 1 | 0 | 0 | 1 | 1 | 0 | 0 | 0 | 1 | ⎍ | 0 |
| Zero propagate vertically | 0 | 0 | 1 | 0 | 1 | 1 | 0 | 0 | 0 | 1 | ⎍ | 0 |
| One propagate horizontally | 0 | 1 | 0 | 0 | 0 | 0 | 1 | 1 | 0 | 1 | ⎍ | 0 |
| Zero propagate horizontally | 0 | 0 | 1 | 0 | 0 | 0 | 1 | 1 | 0 | 1 | ⎍ | 0 |

TABLE 3

| OPERATIONS ON WORDS WITH RESPONSE UNITS SET | S | C1 | C2 | I | U | D | R | L | P | S | Cl | RC |
|---|---|---|---|---|---|---|---|---|---|---|---|---|
| AND downwards | 0 | 0 | 1 | 0 | 0 | 1 | 0 | 0 | 0 | 0 | ⎍ | 0 |
| AND upwards | 0 | 0 | 1 | 0 | 1 | 0 | 0 | 0 | 0 | 0 | ⎍ | 0 |
| AND leftwards | 0 | 0 | 1 | 0 | 0 | 0 | 0 | 1 | 0 | 0 | ⎍ | 0 |
| AND rightwards | 0 | 0 | 1 | 0 | 0 | 0 | 1 | 0 | 0 | 0 | ⎍ | 0 |
| OR with word above | 0 | 1 | 0 | 0 | 0 | 1 | 0 | 0 | 0 | 0 | ⎍ | 0 |
| OR with work below | 0 | 1 | 0 | 0 | 1 | 0 | 0 | 0 | 0 | 0 | ⎍ | 0 |
| OR with bits on right | 0 | 1 | 0 | 0 | 0 | 0 | 0 | 1 | 0 | 0 | ⎍ | 0 |
| OR with bits on left | 0 | 1 | 0 | 0 | 0 | 0 | 1 | 0 | 0 | 0 | ⎍ | 0 |
| OR with input word | 1 | 0 | 0 | 0 | 0 | 0 | 0 | 0 | 0 | 0 | ⎍ | 0 |
| AND with input word | 1 | 0 | 1 | 0 | 0 | 0 | 0 | 0 | 0 | 0 | ⎍ | 0 |
| Shift marked words up | 0 | 1 | 1 | 0 | 1 | 0 | 0 | 0 | 0 | 0 | ⎍ | 0 |
| Shift marked words down | 0 | 1 | 1 | 0 | 0 | 1 | 0 | 0 | 0 | 0 | ⎍ | 0 |
| Shift marked words right | 0 | 1 | 1 | 0 | 0 | 0 | 1 | 0 | 0 | 0 | ⎍ | 0 |
| Shift marked words left | 0 | 1 | 1 | 0 | 0 | 0 | 0 | 1 | 0 | 0 | ⎍ | 0 |
| Load to marked words | 1 | 1 | 1 | 0 | 0 | 0 | 0 | 0 | 0 | 0 | ⎍ | 0 |
| Invert marked bits of matched words | 1 | 1 | 1 | 1 | 0 | 0 | 0 | 0 | 0 | 0 | ⎍ | 0 |
| Ones propagate horizontally | 0 | 1 | 0 | 0 | 0 | 0 | 1 | 1 | 0 | 0 | ⎍ | 0 |
| Zero propagate horizontally | 0 | 0 | 1 | 0 | 0 | 0 | 1 | 1 | 0 | 0 | ⎍ | 0 |

TABLE 4

OPERATIONS ON FIRST MATCHED WORD IN STORE

| | S | C1 | C2 | I | U | D | R | L | P | S | C1 | | RC |
|---|---|---|---|---|---|---|---|---|---|---|---|---|---|
| AND with word stored above | 0 | 0 | 1 | 0 | 0 | 1 | 0 | 0 | 1 | 0 | ⎍ | | 0 |
| AND with word stored below | 0 | 0 | 1 | 0 | 1 | 0 | 0 | 0 | 1 | 0 | ⎍ | | 0 |
| AND with bit to right | 0 | 0 | 1 | 0 | 0 | 0 | 1 | 0 | 1 | 0 | ⎍ | | 0 |
| AND with bits to left | 0 | 0 | 1 | 0 | 0 | 0 | 0 | 1 | 1 | 0 | ⎍ | | 0 |
| AND with input word | 1 | 0 | 1 | 0 | 0 | 0 | 0 | 0 | 1 | 0 | ⎍ | | 0 |
| OR with word above | 0 | 1 | 0 | 0 | 0 | 1 | 0 | 0 | 1 | 0 | ⎍ | | 0 |
| OR with word below | 0 | 1 | 0 | 0 | 1 | 0 | 0 | 0 | 1 | 0 | ⎍ | | 0 |
| OR with bit to right | 0 | 1 | 0 | 0 | 0 | 0 | 1 | 0 | 1 | 0 | ⎍ | | 0 |
| OR with bit to left | 0 | 1 | 0 | 0 | 0 | 0 | 0 | 1 | 1 | 0 | ⎍ | | 0 |
| OR with input word | 1 | 1 | 0 | 0 | 0 | 0 | 0 | 0 | 1 | 0 | ⎍ | | 0 |
| Shift in word above | 0 | 1 | 1 | 0 | 0 | 1 | 0 | 0 | 1 | 0 | ⎍ | | 0 |
| Shift work up one | 0 | 1 | 1 | 0 | 1 | 0 | 0 | 0 | 1 | 0 | ⎍ | | 0 |
| Shift word right one | 0 | 1 | 1 | 0 | 0 | 0 | 1 | 0 | 1 | 0 | ⎍ | | 0 |
| Shift word left one | 0 | 1 | 1 | 0 | 0 | 0 | 0 | 1 | 1 | 0 | ⎍ | | 0 |
| Load input | 1 | 1 | 1 | 0 | 0 | 0 | 0 | 0 | 1 | 0 | ⎍ | | 0 |
| Output word | | | | | | | | | 1 | 0 | 0̄ | | 0 |
| Invert word marked at input | 1 | 1 | 1 | 1 | 0 | 0 | 0 | 0 | 1 | 0 | ⎍ | | 0 |
| Invert as marked above | 0 | 1 | 1 | 1 | 0 | 1 | 0 | 0 | 1 | 0 | ⎍ | | 0 |
| Exclusive or with input | 1 | 1 | 1 | 1 | 0 | 0 | 0 | 0 | 1 | 0 | ⎍ | | 0 |
| Exclusive or with word above | 0 | 1 | 1 | 1 | 0 | 1 | 0 | 0 | 1 | 0 | ⎍ | | 0 |
| Exclusive or with word below | 0 | 1 | 1 | 1 | 1 | 0 | 0 | 0 | 1 | 0 | ⎍ | | 0 |
| Swap | 0 | 1 | 1 | 0 | 1 | 1 | 0 | 0 | 1 | 0 | ⎍ | | 0 |

TABLE

COMPOUND INSTRUCTION

| | | S | C1 | C2 | I | U | D | R | L | P | S | C1 | | RC1 |
|---|---|---|---|---|---|---|---|---|---|---|---|---|---|---|
| Match | (a) | 1 | 1 | 1 | 1 | 0 | 0 | 0 | 0 | 0 | 1 | ⎍ | | 0 |
| | (b) | 1 | 1 | 1 | 1 | 0 | 0 | 0 | 0 | 0 | 1 | 0 | ⎍ | |
| | (c) | 1 | 1 | 1 | 1 | 0 | 0 | 0 | 0 | 0 | 1 | ⎍ | | 0 |
| No Operation | | 0 | 0 | 0 | 0 | 0 | 0 | 0 | 0 | 0 | 0 | 0 | | 0 |
| Invert (all data inputs = 1) | | 1 | 1 | 1 | 1 | 0 | 0 | 0 | 0 | 0 | 1 | ⎍ | | 0 |
| Set store to zero (all data inputs = 0) | | 1 | 1 | 0 | 0 | 0 | 0 | 0 | 0 | 1 | ⎍ | | | |
| Set store to 1 (all data inputs = 1) | | 1 | 1 | 1 | 0 | 0 | 0 | 0 | 0 | 0 | 1 | ⎍ | | 0 |
| Set all response units | (1 in first data position) (a) | 0 | 1 | 1 | 0 | 0 | 0 | 0 | 0 | 0 | 1 | 0 | ⎍ | |
| | (0 in first data position) (b) | 0 | 1 | 1 | 0 | 0 | 0 | 0 | 0 | 0 | 1 | 0 | ⎍ | |
| Increment selected word by 1 | | 0 | 0 | 0 | 1 | 0 | 0 | 1 | 0 | 1 | 0 | ⎍ | | 0 |
| Step Priority | | 0 | 0 | 0 | 0 | 0 | 0 | 0 | 0 | 1 | 0 | 0 | ⎍ | |

The above description has been of one embodiment only and is not intended to be limiting to the invention. Alternative arrangements will readily be seen by those skilled in the art. For example each cell has been provided with AND, OR, INVERT, and SHIFT logic capabilities and obviously more complex logic operations may be incorporated if required. Also the cells have used SN74101 type toggles although any toggle circuit displaying the defined functions could be used.

What we claim is:

1. An associative processor comprising in combination an associative store and a program store, the associative store including, an array of associative memory cells arranged in equal multi-bit memory words each cell having input, output and match paths, a plurality of response circuits one for each memory word in said array and connected to the match path of all the cells in a memory word, a multi-bit input register, for use in the content addressing operations, each bit of which is connected to the input path of the corresponding bit of all the memory words, and a multi-bit output register, for use in reading information from the store, and each bit of the output register is connected to the output path of the corresponding bit of all the memory words, the improvement comprising a command signal highway connecting the program store to all the response circuits, said highway being arranged to carry logic manipulative operation control signals, and the associative memory cells each include logic manipulative means for conditioning the cell to assume a state indicative of, i. the logic AND of an input data bit with the data bit stored in the memory cells, ii. the logic OR of an input data bit with the data bit stored in the memory cell, or iii. the inverse of the state of the data bit stored in the memory, the actual operation performed being defined by the command signals passed to the cells of a word by the activation of a response circuit following an associative store match operation.

2. An associative processor according to claim 1 wherein the output path from each cell is connected to (i) the input path of the corresponding memory cell in contiguous words and (ii) the input path of contiguous bit memory cells of the same word and each memory cell includes input path gating means for selecting the appropriate path to provide the input data bit to be used in a logic manipulative operation.

3. An associative processor as claimed in claim 2 in which the command signal highway comprises an input/shift select wire, firs and second cell function control wires, an invert wire, up, down, right and left shift control wires and a cell clock pulse wire.

4. An associative processor as claimed in claim 3 in which the first and second cell function control wires when set to a first state cause, upon the occurrence of a clock pulse, the cell conditions to be set to the states defined by the input register, when the first control wire is set to the first state and the second control wire is set to a second state the cell performs an OR operation involving the cell state and the selected input path condition whereas when the first control wire is set to the second state and the second control wire is set to the first state the cell performs an AND operation involving the selected input path condition.

5. An associative processor as claimed in claim 4 in which the program store is used to store a sequence of command signals and the sequence is arranged to be active upon a selected memory word to cause the cells of the word to perform a sequence of logic manipulative operations.

6. An associative processor as claimed in claim 5 wherein each cell includes a clocked JK toggle having a pair of AND gates OR connected onto each input.

* * * * *